United States Patent
Tsai et al.

(10) Patent No.: US 7,358,612 B2
(45) Date of Patent: Apr. 15, 2008

(54) PLASMA TREATMENT AT FILM LAYER TO REDUCE SHEET RESISTANCE AND TO IMPROVE VIA CONTACT RESISTANCE

(75) Inventors: Jian-Shin Tsai, Taiching County (TW); Yu-Hua Chou, Taipei (TW); Tzo-Hung Luo, Taichung (TW); Chi-Chan Tseng, Pingtung County (TW); Wei Zhang, Singapore (TW); Jong-Chen Yang, Shinchu County (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 89 days.

(21) Appl. No.: 11/419,537

(22) Filed: May 22, 2006

(65) Prior Publication Data

US 2006/0216916 A1 Sep. 28, 2006

Related U.S. Application Data

(62) Division of application No. 10/842,169, filed on May 10, 2004, now Pat. No. 7,067,409.

(51) Int. Cl.
H01L 23/48 (2006.01)
H01L 23/52 (2006.01)
H01L 29/40 (2006.01)

(52) U.S. Cl. .............. 257/774; 257/288; 257/622; 257/E21.302; 257/E21.311; 257/E21.577

(58) Field of Classification Search ........... 257/774, 257/127, 69, 288, 396, 204, 761, 763, 622
See application file for complete search history.

(56) References Cited

U.S. PATENT DOCUMENTS

| | | |
|---|---|---|
| 5,672,385 A | 9/1997 | Jimba et al. |
| 5,981,388 A | 11/1999 | Miyamoto |
| 6,040,021 A | 3/2000 | Miyamoto |
| 6,071,811 A | 6/2000 | Ngan |
| 6,197,683 B1 | 3/2001 | Kang et al. |
| 6,297,147 B1 | 10/2001 | Yang et al. |
| 6,306,265 B1 | 10/2001 | Fu et al. |
| 6,313,035 B1 | 11/2001 | Sandhu et al. |
| 6,319,766 B1 * | 11/2001 | Bakli et al. ............. 438/240 |
| 6,323,554 B1 | 11/2001 | Joshi et al. |
| 6,328,804 B1 | 12/2001 | Murzin et al. |
| 6,387,790 B1 | 5/2002 | Domenicucci et al. |
| 6,399,491 B2 | 6/2002 | Jeon et al. |
| 6,399,512 B1 | 6/2002 | Blosse et al. |
| 6,462,417 B1 | 10/2002 | Wang et al. |
| 6,468,604 B1 | 10/2002 | Tobe et al. |
| 6,475,902 B1 | 11/2002 | Hausmann et al. |
| 6,491,978 B1 | 12/2002 | Kalyanam |
| 6,514,848 B1 | 2/2003 | Abe |
| 6,524,951 B2 | 2/2003 | Hu |
| 6,531,780 B1 | 3/2003 | Woo et al. |
| 6,638,810 B2 | 10/2003 | Bakli et al. |
| 6,743,473 B1 | 6/2004 | Parkhe et al. |
| 7,067,409 B2 * | 6/2006 | Tsai et al. ............. 438/586 |

* cited by examiner

*Primary Examiner*—David Nhu
(74) *Attorney, Agent, or Firm*—Haynes Boone, LLP

(57) ABSTRACT

A method of manufacturing a semiconductor device contact including forming an insulating layer over a substrate and forming an agglutinating layer over the insulating layer. The agglutinating layer is then exposed to a plasma treatment. A barrier layer is formed over the plasma-treated agglutinating layer, and a conductive layer is formed over the barrier layer.

20 Claims, 1 Drawing Sheet

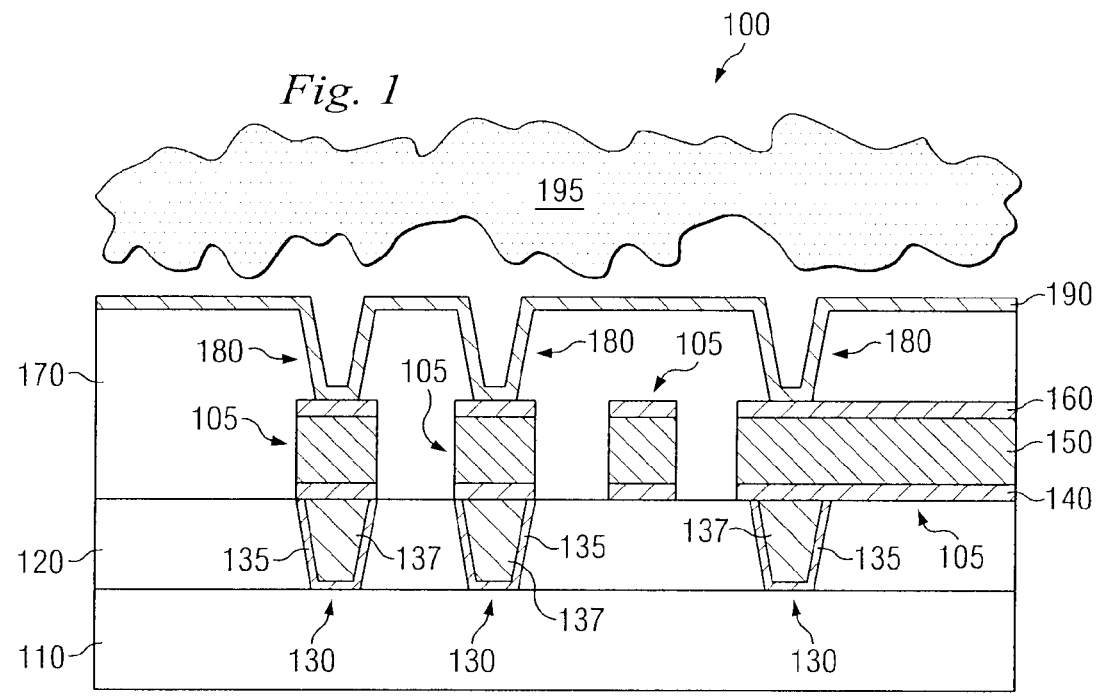
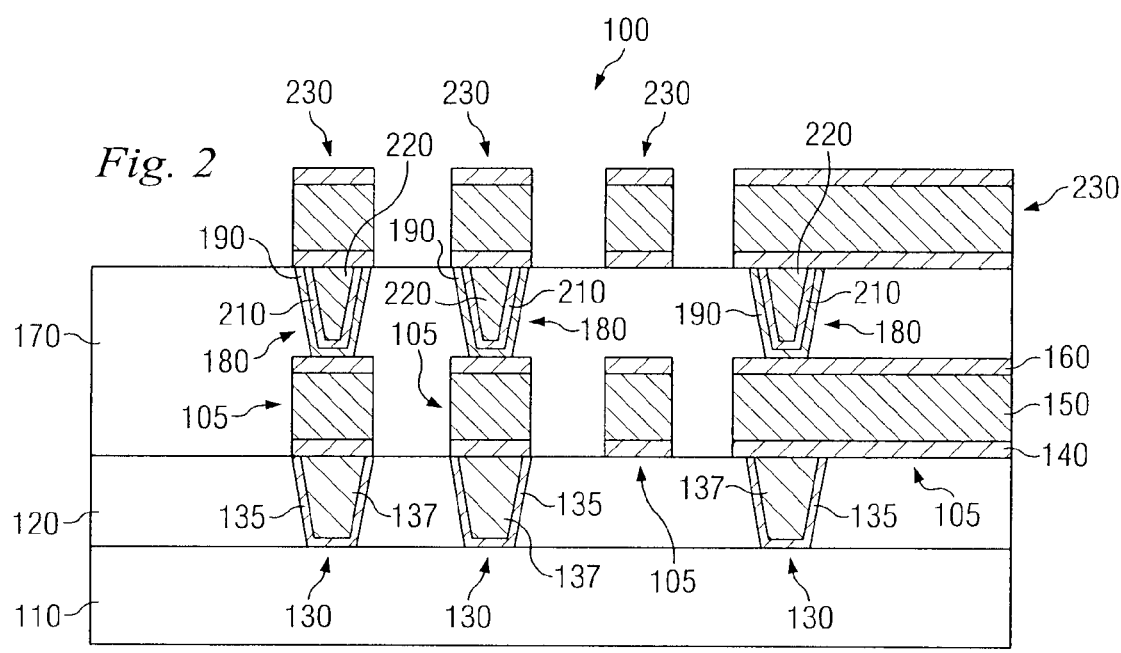

PLASMA TREATMENT AT FILM LAYER TO REDUCE SHEET RESISTANCE AND TO IMPROVE VIA CONTACT RESISTANCE

RELATED APPLICATION

This application is a divisional of U.S. application Ser. no. 10/842,169, filed May 10, 2004, entitled, "Plasma Treatment at Film Layer to Reduce Sheet Resistance and to Improve via Contact Resistance", now issued as U.S. Pat. No. 7,067,409.

BACKGROUND

Semiconductor device geometries continue to dramatically decrease in size. For example, existing semiconductor devices routinely include features having dimensions less than 90 nm. A challenge that has become ever more difficult as this scaling continues has been improving the contact and sheet resistance of the vias and interconnects employed to interconnect the myriad logic devices formed in or on a substrate.

The fabrication of such a via, interconnect, or other contact can include forming an insulating layer over a substrate having complementary metal-oxide-semiconductor (CMOS) devices or other logic device formed therein. Recesses or other openings are then etched or otherwise formed in the insulating layer to expose portions of the logic devices. The openings in the insulating layer are then lined with a first barrier layer which may comprise titanium, tantalum, or alloys thereof. The partially completed device may then be pre-heated in preparation for the subsequent formation of a second barrier layer. The second barrier layer typically comprises titanium, tantalum, nitride, or alloys thereof, such as may be formed by metal-organic-chemical-vapor-deposition (MOCVD).

However, the conventional processes employed to form vias or other contacts result in contacts that exhibit excessive sheet resistance $R_s$ and contact resistance $R_c$. Excessive sheet resistance $R_s$ can prevent adequate ohmic contact between vias and interconnects, and excessive contact resistance $R_c$ can increase power requirements and decrease performance of devices incorporating the vias and interconnects.

This problem has plagued semiconductor development for some time, to the extent that many solutions have been proposed. A typical approach has been separately improving the quality of the first and second barrier layers. However, those skilled in the art now recognize that individually improving the quality of the first and second barrier layers cannot achieve the goal of reducing both sheet resistance $R_s$ and contact resistance $R_c$. Moreover, the proposed solutions typically have a severe impact on throughput, often including multi-cycle treatments or depositions that undesirably consume precious process time and render manufacturing more complex.

SUMMARY OF THE DISCLOSURE

The present disclosure relates to methods of manufacturing semiconductor device contacts, the resulting structure, and integrated circuits including the contacts. In one embodiment, a method of manufacturing a semiconductor device contact according to aspects of the present disclosure includes forming an insulating layer over a substrate and forming an agglutinating layer over the insulating layer. The agglutinating layer may then be exposed to a plasma treatment. A barrier layer may then be formed over the plasma-treated agglutinating layer, and a conductive layer may be formed over the barrier layer.

In another embodiment, the method includes providing a substrate having logic devices formed therein and forming an insulating layer over the substrate and logic devices. A plurality of recesses may be formed in the insulating layer to expose portions of the logic devices. An agglutinating layer may be formed over the insulating layer and at least partially within the plurality of recesses, and the agglutinating layer may be exposed to a plasma treatment. A barrier layer may be formed over the plasma-treated agglutinating layer and at least partially within the plurality of recesses, and a bulk conductive layer may be formed over the barrier layer to fill the plurality of recesses.

The present disclosure also provides a system for manufacturing a semiconductor device. In one embodiment, the system includes means for positioning a substrate among a plurality of process chambers, means for forming an insulating layer over the substrate within one of the plurality of process chambers, and means for forming an agglutinating layer over the insulating layer within one of the plurality of process chambers. The system may also include means for plasma treating the agglutinating layer, means for forming a barrier layer over the plasma-treated agglutinating layer within one of the plurality of process chambers, and means for forming a conductive layer over the barrier layer within one of the plurality of process chambers.

The present disclosure also provides a semiconductor device that may incorporate an embodiment of the semiconductor contact described above. In one embodiment, the semiconductor device includes a substrate and a plurality of logic devices located over the substrate. An insulating layer may be located over the logic devices, and may include a plurality of recesses exposing underlying ones of the logic devices. A plasma-treated agglutinating layer may be located over the insulating layer, including within the plurality of recesses. A barrier layer may be located over the plasma-treated agglutinating layer, including within the plurality of recesses. The semiconductor device may also include a conductive layer located over the barrier layer and within the plurality of recesses.

The foregoing has outlined features of various embodiments of the present disclosure so that those skilled in the art may better understand the detailed description that follows. Those skilled in the art should appreciate that they can readily use the present disclosure as a basis for designing or modifying other structures for carrying out the same purposes and/or achieving the same advantages of embodiments described herein. Those skilled in the art should also realize that such equivalent constructions do not depart from the spirit and scope of the present disclosure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings.

FIG. 1 is a sectional view of at least a portion of one embodiment of a semiconductor device in an intermediate stage of manufacture according to aspects of the present disclosure.

FIG. 2 is a sectional view of the device shown in FIG. 1 in a subsequent stage of manufacture according to aspects of the present disclosure.

DETAILED DESCRIPTION

It is to be understood that the following disclosure provides many different embodiments, or examples, for implementing different features according to aspects of the present disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, according to one embodiment, a semiconductor device 100 includes a substrate 110 and a first dielectric layer 120. The substrate 110 may be a conventional substrate employed in semiconductor and other integrated circuit devices. As such, the substrate 110 may include one or more logic devices requiring interconnection. The first dielectric layer 120 may comprise a phosphosilicate glass (PSG), a borophospho-silicate glass (BPSG), or a low-k dielectric, such as a porous or non-porous spin-on-glass or a coating formed by chemical-vapor-deposition (CVD).

The first dielectric layer 120 is patterned to form a plurality of contacts, layer interconnects, or vias (hereinafter collectively referred to as "vias") 130. Such patterning may be achieved by conventional etching processes, including photolithographic processes employing a photoresist mask having openings therein corresponding to the vias 130.

The vias 130 may be lined with a first barrier layer 135, which may comprise Ti, Ta, TiW, TiN, TaN, SiOC, SiC, and/or other materials. In one embodiment, the first barrier layer 135 may be formed by depositing Ti by ionized metal plasma (IMP) deposition and subsequently depositing TiN by metal-organic CVD (MOCVD). The first barrier layer 135 may also be deposited by atomic layer deposition (ALD), CVD, physical-vapor deposition (PVD), combinations thereof, and/or other processes.

The vias 130 are then filled to form conductive plugs 137, such as with tungsten, aluminum, copper, and/or other conductive materials. The plugs 137 may be deposited by ALD, CVD, PVD, and/or other methods. In some embodiments, a seed layer may be deposited before the bulk material forming the plugs is deposited, such as in embodiments in which the plugs 137 substantially comprise copper. After deposition, the plugs 137 may be planarized, such as by a plasma or other etchback process, or by chemical-mechanical polishing (CMP).

The filled vias 130 and the first dielectric layer 120 are then coated with a second barrier layer 140. The second barrier layer 140 may be deposited by ALD, CVD, PVD, and/or other methods, and may comprise Ti, Ta, TiW, TiN, TaN, SiOC, SiC, and/or other materials. A bulk metal layer 150 is then deposited over the second barrier layer 140. The bulk metal layer 150 may comprise Al, Cu, and/or other materials, including those typically employed as interconnect conductors. The bulk metal layer 150 may be deposited by ALD, CVD, PVD, sputtering, electroplating, and/or other methods.

A third barrier layer 160 may then be formed over the bulk metal layer 150 by ALD, CVD, PVD, and/or other methods. The third barrier layer 160 may comprise Ti, Ta, TiW, TiN, TaN, SiOC, SiC, and/or other materials. The third barrier layer 160 may be an anti-reflective coating (ARC), such as that which may be utilized in subsequent lithographic processing. As such, the third barrier layer 160 may be coated with or may substantially comprise an ARC layer.

The second barrier layer 140, the bulk metal layer 150, and the third barrier layer 160 may then be patterned to form conductive interconnects 105. For example, a photoresist mask layer may be formed over the third barrier layer 160 and an etch process may remove exposed portions materials under the mask. The removal process may include a chemical etch, a dry (plasma) etch, and/or other processes.

Thereafter, a second dielectric layer 170 is formed over and between the conductive interconnects 105. The second dielectric layer 170 may comprise a low-k dielectric material, such as a porous or non-porous spin-on-glass. In one embodiment, the second dielectric layer 170 comprises ELK, which is typically a porous $SiO_2$ film having pores filled with an inert gas or air to provide the low-k dielectric properties, such as MesoELK™, a product of Schumacher of Carlsbad, Calif. The second dielectric layer 170 may be then patterned to form second vias 180.

Thereafter, an agglutinating layer 190 may be formed over the second dielectric layer 170 and within the second vias 180, as shown in FIG. 1. The agglutinating layer 190 may comprise Ti, Ta, TiW, TiN, TaN, SiOC, SiC, and/or other materials. The agglutinating layer 190 may prevent the diffusion of subsequently formed layers into the underlying dielectric layer 170, and may also improve the adhesion of layers subsequently formed within the vias 180. Moreover, when employed in conjunction with aspects of the present disclosure, as discussed below, the agglutinating layer 190 may decrease the contact resistance $R_c$ of the contacts 180 being formed.

The agglutinating layer 190 may be formed by IMP deposition, wherein the partially completed device 100 may be heated to a process temperature ranging between about 200° C. and about 500° C. Heating employed during the IMP deposition of the agglutinating layer 190 may provide improved control over grain size. For example, a lower process temperature may provide smaller grain size as compared to a higher process temperatures. The grain size of the agglutinating layer 190 may also be controlled by other process parameters. For example, an increased sputter rate during formation of the agglutinating layer 190 may provide a larger grain size than slower sputtering processes. A larger grain size for the agglutinating layer 190 may reduce the sheet and contact resistance.

Following the deposition of the agglutinating layer 190, a plasma treatment process may be performed. For example, the partially completed device 100 may be positioned in a process chamber, wherein an $N_2+H_2$ plasma 195 (or other plasma composition) is generated. In one embodiment, the plasma-treatment may occur during a preliminary or "heat-up" stage of processing a subsequently formed layer. Thus, the plasma-treatment process may be an in-situ process that is readily inserted into existing fabrication procedures. The plasma-treatment process may also be an ex-situ process, wherein the partially completed device 100 may be temporarily removed from a processing chamber or environment to perform the plasma-treatment process. In one embodiment, the plasma-treatment may employ a process gas mixture comprising nitrogen or a nitrogen-containing composition (e.g., $N_2$) at a flow rate of about 200 sccm and/or hydrogen or a hydrogen-containing composition (e.g., $H_3$) at a flow rate of about 300 sccm. The plasma-treatment may also employ a process pressure of about 1.3 torr, a process temperature of about 450° C., and/or an RF power of about 750 W. The process time of the plasma-treatment may range between about 5 seconds and about 90 seconds, and may be dependent on the thickness of the agglutinating layer 190. For example, in one embodiment, the thickness of the agglutinating layer 190 may range between about 100 angstroms and about 160 angstroms, and the process time may range between about 10 seconds and about 30 seconds.

Because the agglutinating layer 190 is the most recently formed layer prior to the plasma-treatment process, the plasma-treatment process has the greatest effect on the agglutinating layer 190, at least in the present embodiment. The plasma-treatment process may reduce the contact resistance $R_c$ of the resulting vias 180 by at least about 25%. Moreover, as discussed above, the plasma-treatment process may be performed in-situ and during a preliminary stage of subsequent layer formation, such that implementing a plasma-treatment process according to aspects of the present disclosure may be achieved with little or no impact to manufacturing time or throughput.

In one embodiment, the plasma-treatment process may alter the agglutinating layer 190 by enlarging grain size and/or by implanting a thin layer of one or more components of the treating plasma, such as $N_2$, into or onto the agglutinating layer 190 or other underlying layers exposed to the plasma-treatment. The increase in grain size may improve the sheet resistance $R_s$ and the contact resistance $R_c$, and may also improve the quality of the interface between the second dielectric layer 170, the agglutinating layer 190, and subsequently formed layers. In one embodiment, the grain size of the completed agglutinating layer 190 may be increased by at least about 20% as a result of the plasma-treatment.

Referring to FIG. 2, illustrated is a sectional view of the device 100 shown in FIG. 1 in a subsequent stage of manufacture. A barrier layer 210 may be deposited over the agglutinating layer 190 after the plasma-treatment process is performed. The barrier layer may comprise Ti, Ta, TiW, TiN, TaN, SiOC, SiC, and/or other materials, and may be deposited by ALD, CVD, PVD, and/or other methods. In one embodiment, the barrier layer 210 may be formed by MOCVD, which may utilize an organo-metallic precursor such as $TiCl_4$, TDMAT, TDEAT, and/or other materials.

In one embodiment, the barrier layer 210 may be formed by a series of in-situ processes, including a first deposition of TiN by MOCVD, an $H_2+N_2$ plasma densification process, and a second deposition of TiN by MOCVD. The plasma densification of the TiN deposited by MOCVD may at least partially drive carbon from previously formed TiN layers. The alternating plasma densification and MOCVD processes may be repeated until a desired thickness of the barrier layer 210 is achieved. This type of process may be employed when utilizing TDMAT or TDEAT as a Ti precursor. In another embodiment, $TiCl_4$ is employed as a precursor, and another plasma treatment may be employed, and/or a post anneal/plasma treatment may be implemented.

As shown in FIG. 2, manufacture of the device 100 may continue by repeating previously performed procedures to complete the device 100. For example, plugs 220 may be formed in the vias 180 over the plasma-treated agglutinating layer 190 and the barrier layer 210, wherein the plugs 220 may be similar in composition and manufacture to the plugs 137 described above. A planarizing process may then be performed to complete the vias 180. Conductive interconnects 230 may then be formed over the completed vias 180, wherein the conductive interconnects 230 may be similar in composition and manufacture to the conductive interconnects 105 described above. Thus, the processes performed to fabricate the agglutinating layer 190, including the plasma-treatment process, may be repeated as necessary to fabricate additional agglutinating layers. Consequently, conductive interconnects and vias having improved sheet resistance $R_s$ and contact resistance $R_c$ may be fabricated at many levels of the interconnect structure, including and in addition to those illustrated in FIGS. 1 and 2, according to aspects of the present disclosure. For example, the vias 130 formed in the dielectric layer 120 may be similar in composition and manufacture to the vias 180 formed in the dielectric layer 170, and may include a plasma-treated agglutinating layer.

Thus, the present disclosure introduces the concept of modifying existing contact fabrication procedures and structures that conventionally include first and second barrier layers deposited before a bulk conductive material of the contact. That is, in contrast to the conventional first and second barrier layers, an agglutinating layer is first deposited and plasma treated before a barrier layer and the bulk conductive material are deposited, according to aspects of the present disclosure. In one embodiment, the plasma-treated agglutinating layer, the barrier layer and the bulk conductive material may collectively form a contact having a sheet resistance $R_s$ ranging between about 70 $\Omega/nm^2$ and about 130 $\Omega/nm^2$ and a contact resistance $R_c$ ranging between about 6 $\Omega/nm^2$ and about 9 $\Omega/nm^2$ other sheet resistance and contact resistance values are within the scope of the present disclosure. Moreover, sheet and contact resistance values that are as much as 25% less than with conventional processes and structures may be obtained by implementing aspects of the present disclosure.

The scope of the present disclosure also includes a system for manufacturing a semiconductor device, such as the device 100 shown in FIGS. 1 and 2. Such a system may be at least similar to a deposition cluster system, such as an Endura platform distributed by Applied Materials, Inc., of Santa Clara, Calif.

Such a system may include two hexagonal or otherwise shaped carrier chambers, wherein substrates undergoing processing may be transported by robotic arms. The system may include first and second load lock chambers for loading substrates into the system. The load lock chambers may also serve as holding chambers between processes performed in other chambers, such as when a processing chamber is undergoing purging, preheating, etc.

The system may also include preparation chambers. The preparation chambers may be employed to orient substrates, such as for positioning a surface to be processed or precisely positioning alignment notches on the substrates. The preparation chambers may also be employed as plasma cleaning reactors, wherein substrates may be processed prior to or after a film deposition or etching process.

The remaining chambers in the system may be conventional or future-developed processing chambers, including those employed to form various insulating and metallization layers conventionally found in semiconductor devices. For example, one or more of the chambers may be employed to perform IMP deposition of Ti, Ta, TaN, and/or other materials. As discussed above, IMP deposition is one process by which the agglutinating layer 190 shown in FIG. 1 may be formed. One or more of the chambers may also be employed to perform MOCVD deposition of Ti, Ta, TaN, and/or other materials, including with the use of an organo-metallic precursor. Furthermore, the plasma-treatment process described above with respect to the agglutinating layer 190 shown in FIG. 1 may be performed in one or more of the chambers.

In some embodiments, if the plasma-treatment process includes an $N_2+H_2$ plasma at 450° C., and the agglutinating layer being plasma-treated comprises TiN deposited by MOCVD minimum values can be observed for the average sheet resistance $R_{s(ave)}$ and the sheet resistance uniformity $R_sU\%$ when the agglutinating layer 190 is plasma-treated immediately following its deposition.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The invention claimed is:

1. A semiconductor device, comprising:
a substrate;
a plurality of logic devices located over the substrate;
an insulating layer located over the plurality of logic devices and including a plurality of recesses exposing underlying ones of the plurality of logic devices;
an agglutinating layer located over the insulating layer including within the plurality of recesses, the agglutinating layer having an enlarged grain size due to plasma treatment with a process chemistry comprising nitrogen and hydrogen;
a barrier layer located over the plasma-treated agglutinating layer including within the plurality of recesses; and
a conductive layer located over the barrier layer including within the plurality of recesses.

2. The semiconductor device recited in claim 1 wherein the enlarged grain size of the plasma-treated agglutinating layer is about 20% larger than prior to plasma treatment.

3. The semiconductor device recited in claim 1 wherein the plasma-treated agglutinating layer, the barrier layer and the conductive layer collectively form a contact having a sheet resistance ranging between about 70 $\Omega/nm^2$ and about 130 $\Omega/nm^2$.

4. The semiconductor device recited in claim 1 wherein the plasma-treated agglutinating layer, the barrier layer and the conductive layer collectively form a contact having a contact resistance ranging between about 6 $\Omega/nm^2$ and about 9 $\Omega/nm^2$.

5. The semiconductor device recited in claim 4 wherein the contact has a sheet resistance ranging between about 70 $\Omega/nm^2$ and about 130 $\Omega/nm^2$.

6. The semiconductor device recited in claim 1 wherein the agglutinating layer comprises a material selected from the group consisting of: Ti, Ta, TiW, TiN, TaN, SiOC, and SiC.

7. The semiconductor device recited in claim 1 wherein the agglutinating layer has a thickness ranging between about 100 angstroms and about 160 angstroms.

8. The semiconductor device recited in claim 1 wherein the barrier layer comprises a material selected from the group consisting of: Ti, Ta, TiW, TiN, TaN, SiOC, and SiC.

9. The semiconductor device recited in claim 1 wherein the barrier layer includes a plurality of plasma densified TiN layers.

10. A semiconductor device, comprising:
a logic device located over a substrate;
an insulating layer located over the logic device, wherein a recess in the insulating layer exposes at least a portion of the logic device;
an agglutinating layer located over the insulating layer and within the recess, the agglutinating layer having an enlarged grain size due to plasma treatment, wherein the enlarged grain size of the plasma-treated agglutinating layer is about 20% larger than prior to plasma treatment;
a barrier layer located over the plasma-treated agglutinating layer and within the recess; and
a conductive layer located over the barrier layer and within the recess.

11. The semiconductor device recited in claim 10 wherein the agglutinating layer has the enlarged grain size due to plasma treatment with a process chemistry comprising nitrogen and hydrogen.

12. The semiconductor device recited in claim 10 wherein the plasma-treated agglutinating layer, the barrier layer and the conductive layer collectively form a contact having a sheet resistance ranging between about 70 $\Omega/nm^2$ and about 130 $\Omega/nm^2$.

13. The semiconductor device recited in claim 10 wherein the plasma-treated agglutinating layer, the barrier layer and the conductive layer collectively form a contact having a contact resistance ranging between about 6 $\Omega/nm^2$ and about 9 $\Omega/nm^2$.

14. The semiconductor device recited in claim 13 wherein the contact has a sheet resistance ranging between about 70 $\Omega/nm^2$ and about 130 $\Omega/nm^2$.

15. The semiconductor device recited in claim 10 wherein the agglutinating layer comprises a material selected from the group consisting of: Ti, Ta, TiW, TiN, TaN, SiOC, and SiC.

16. The semiconductor device recited in claim 10 wherein the agglutinating layer has a thickness ranging between about 100 angstroms and about 160 angstroms.

17. The semiconductor device recited in claim 10 wherein the barrier layer comprises a material selected from the group consisting of: Ti, Ta, TiW, TiN, TaN, SiOC, and SiC.

18. The semiconductor device recited in claim 10 wherein the barrier layer includes a plasma-densified layer.

19. The semiconductor device recited in claim 10 wherein the barrier layer includes a plurality of plasma-densified TiN layers.

20. A semiconductor device, comprising:
a logic device located over a substrate;
an insulating layer located over the logic device and having a recess that exposes at least a portion of the logic device; and
a contact located within the recess and comprising:
an agglutinating layer having an enlarged grain size due to plasma treatment;
a barrier layer located over the plasma-treated agglutinating layer; and
a conductive layer located over the barrier layer;
wherein the contact has at least one of:
a sheet resistance ranging between about 70 $\Omega/nm^2$ and about 130 $\Omega/nm^2$; and
a contact resistance ranging between about 6 $\Omega/nm^2$ and about 9 $\Omega/nm^2$.

* * * * *